(12) United States Patent  
Sawahata et al.

(10) Patent No.: US 7,564,111 B2
(45) Date of Patent: Jul. 21, 2009

(54) IMAGING APPARATUS (75) Inventors: Koji Sawahata, Kawasaki (JP); Susumu Moriya, Kawasaki (JP); Hiroshi Aoki, Kawasaki (JP); Izumi Kobayashi, Kawasaki (JP); Toshiyuki Honda, Kawasaki (JP); Shigeo Iriguchi, Kawasaki (JP); Masashi Takenaka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/657,590

(22) Filed: Jan. 25, 2007

(65) Prior Publication Data

US 2007/0120050 A1    May 31, 2007

Related U.S. Application Data (63) Continuation of application No. PCT/JP2004/010695, filed on Jul. 28, 2004.

(51) Int. Cl.
*H01L 31/0232* (2006.01)

(52) U.S. Cl. .......................... 257/432; 257/433; 257/81; 257/704; 257/E23.181

(58) Field of Classification Search ................. 257/432, 257/E23.181

See application file for complete search history.

(56) References Cited

U.S. PATENT DOCUMENTS 6,768,516 B2 *   7/2004   Yamada et al. ............... 348/340

2003/0071342 A1 *   4/2003   Honda et al. ................ 257/687

FOREIGN PATENT DOCUMENTS

| JP | 57-162398 A   | 10/1982 |
| JP | 2003-189195 A | 7/2003  |
| JP | 2004-153503 A | 5/2004  |
| JP | 2004-193082 A | 7/2004  |
| JP | 2005-210409 A | 8/2005  |

OTHER PUBLICATIONS

JP02004193082A, Ozaka, Masahiko; Machine-Translation provided by JPO and INPIT.*

* cited by examiner

*Primary Examiner*—Tu-Tu V Ho
(74) *Attorney, Agent, or Firm*—Arent Fox LLP (57) ABSTRACT

In an imaging apparatus constituted of a case body for mounting an imaging device and a flexible substrate bonding to an external connection terminal provided on the case body, the flexible substrate is bent along each face of case body 41 so as to surround case body 41. By bending the flexible substrate, a load applied to the flexible substrate is received at the bent portion of the flexible substrate, there is formed a structure hard to transmit the load to the bonding portion to the external connection terminal. Further, by fixing the case body to a portion of the flexible substrate with an adhesive agent, etc., there is formed a structure not to transmit a stress to the direction of peeling the flexible substrate from the external connection terminal. Also, the case body is covered with the flexible substrate equipped with an electromagnetic wave shield material.

15 Claims, 12 Drawing Sheets

IMAGING APPARATUS

CROSS REFERENCE TO RELATED APPLICATIONS

This application is a continuation of International Application No.PCT/JP2004/010695, filed on Jul. 28, 2004, now pending, herein incorporated by reference.

TECHNICAL FIELD

The present invention relates to an imaging apparatus having an imaging device modularized with an imaging lens, and more particularly the structure of an imaging apparatus constituted of a case body, having an imaging device and an imaging lens, and a substrate connecting therewith.

BACKGROUND ARTS

In recent years, a mobile phone and a portable personal computer having a miniaturized camera incorporated therein are becoming widespread. The miniaturized camera is generally constituted of an imaging device, which is a semiconductor device such as a CMOS sensor, and a lens. As for the mobile phone and the portable personal computer, further size reduction is in progress, which requires further size reduction of the miniaturized camera to be used therefor. In order to satisfy such the requirement, there has been developed an imaging apparatus module formed by modularizing the lens with the CMOS sensor.

The patent document 1 (the official gazette of the Japanese Unexamined Patent Publication No. 2003-189195) shown below discloses an imaging apparatus having a lens modularized with an imaging device.

Figure 1:
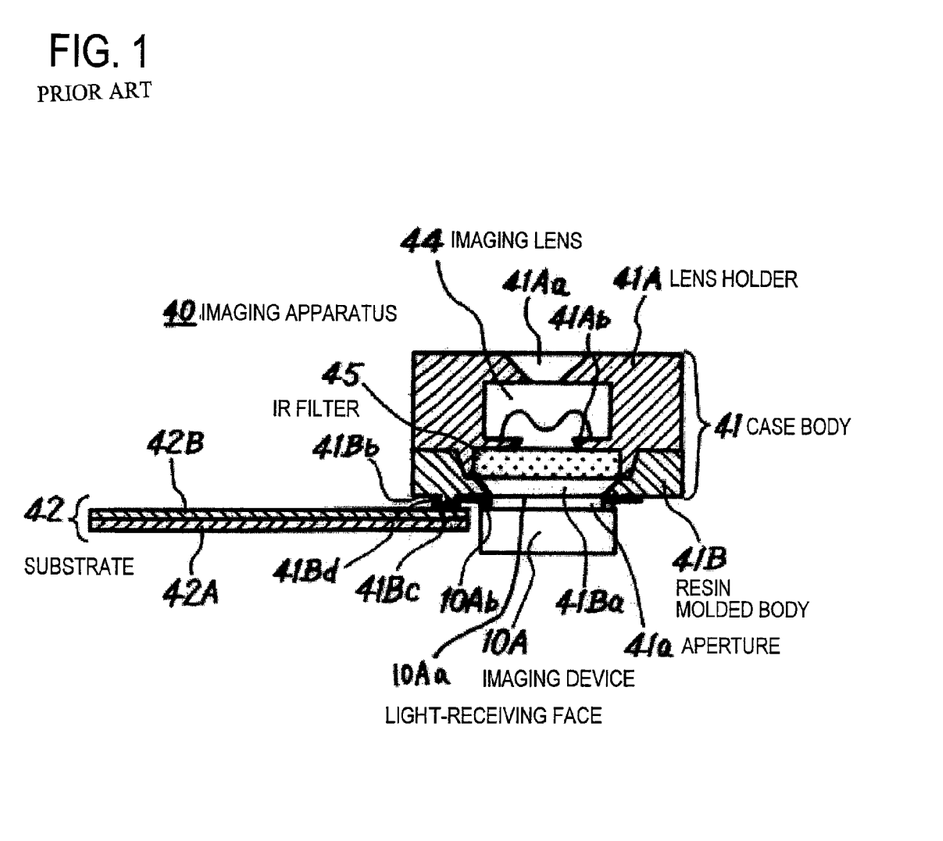
FIG. 1 shows a cross-sectional view of an exemplary configuration of an imaging apparatus having a lens modularized with an imaging device.

FIG. 1 is a cross-sectional view of an exemplary configuration of the imaging apparatus having the lens modularized with the imaging device. An imaging apparatus 40 includes a case body 41 on which an imaging lens 44 and an imaging device 10A are mounted, and a substrate 42 connecting with case body 41. Imaging device 10A is a semiconductor device such as a CMOS sensor, as an example.

Case body 41 is formed of a lens holder 41A and a resin molded body 41B in a separate manner. Lens 44 is disposed substantially at the center of lens holder 41A, and on the upper portion of lens 44, there is formed an aperture 41Aa for fetching an image into the lens. On the lower portion of lens 44, an iris 41Ab is formed, and an IR filter 45 is disposed below iris 41Ab.

Lens holder 41A is mounted on resin molded body 41B having an aperture 41Ba in the center. Resin molded body 41B has electronic components, such as a drive device of imaging device 10A, being incorporated therein, and further, an external connection terminal 41Bd is formed on a protrusion portion 41Bc being formed protrusively from a bottom face 41Bb.

On the bottom face 41Bb of resin molded body 41B, imaging device 10A is flip-chip mounted. A light-receiving face 10Aa of imaging device 10A faces opposite to lens 44 via aperture 41Ba of resin molded body 41B. With this, it is possible to form an image on light-receiving face 10Aa by means of lens 44.

Using external connection terminal 41Bd formed on bottom face 41Bb of resin molded body 41B of case body 41, case body 41 connects with substrate 42. Substrate 42, which is a flexible substrate having flexibility, is constituted of a polyimide film 42A as a base, and wiring 42B of a copper plate or a copper foil being formed on polyimide film 42A. It may also be possible to dispose wiring 42B on both sides of polyimide film 42A.

Figure 2:
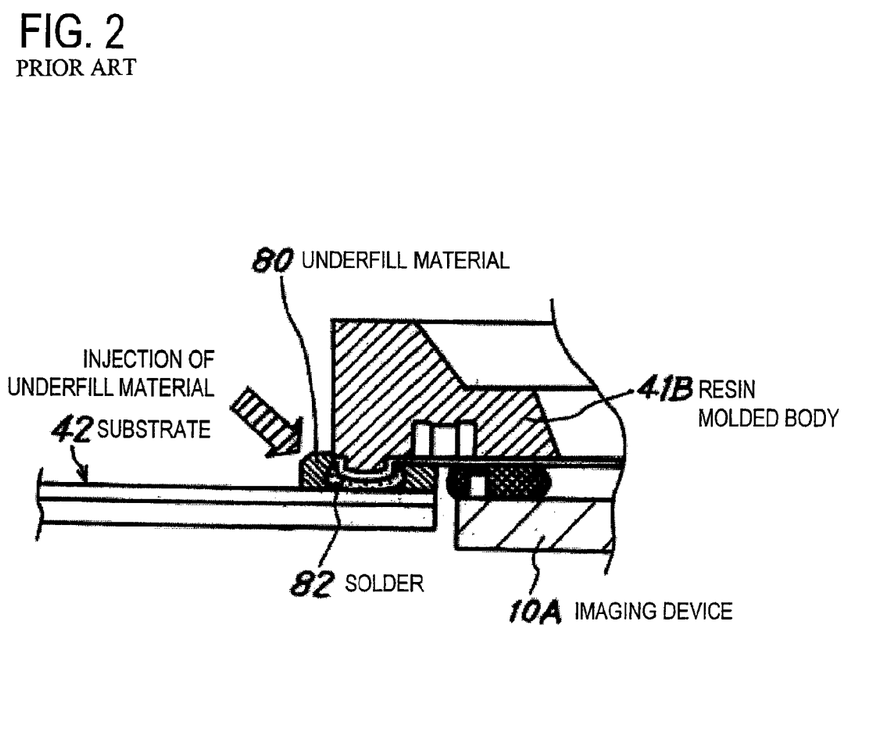
FIG. 2 shows a cross-sectional view illustrating a portion of the imaging apparatus shown in FIG. 1.

FIG. 2 is a cross-sectional view illustrating a portion of the imaging apparatus shown in FIG. 1. In FIG. 2, external connection terminal 41Bd on bottom face 41Bb of resin molded body 41B bonds to substrate 42 using solder 82, etc. Further, between substrate 42 and resin molded body 41B, an underfill material 80 is injected and filled. As underfill material 80, epoxy resin having strong adhesion force is preferable.

By filling underfill material 80 between resin molded body 41B and substrate 42, the bonding between resin molded body 41B and substrate 42 can be reinforced. In case that a flexible substrate is used as substrate 42, it becomes possible to prevent a solder bonding portion from being peeled off or the occurrence of incorrect bonding caused by degradation, even when the flexible substrate is bent repetitively.

Figure 3A:
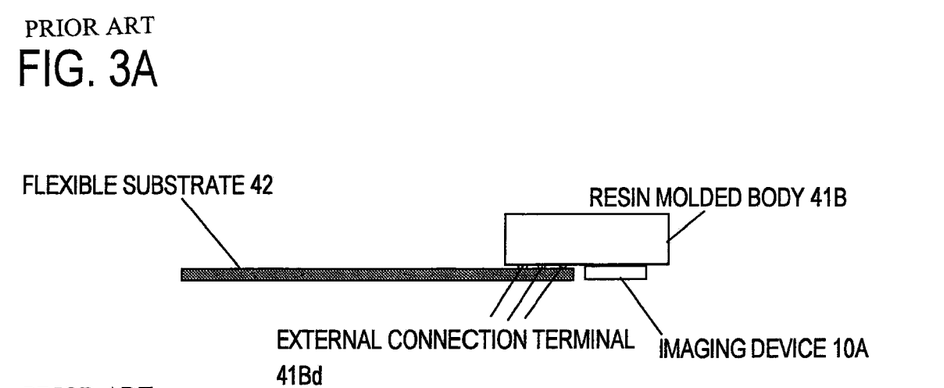
FIG. 3 shows a diagram schematically illustrating a configuration procedure of the configuration shown in FIG. 2.
Figure 3B:
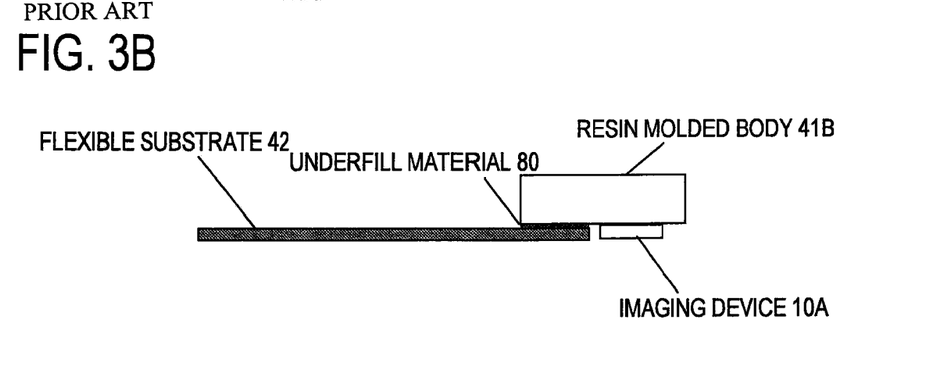
Figure 3C:
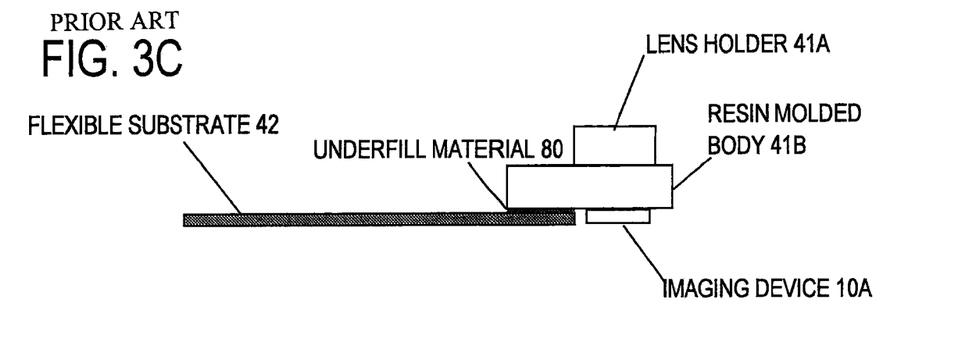

FIG. 3 is a diagram schematically illustrating a configuration procedure of the configuration shown in FIG. 2. First, in FIG. 3(a), external connection terminal 41Bd on resin molded body 41B having imaging device 10A mounted thereon is bonded with solder to the wiring pattern of substrate 42 constituted of flexible substrate. Then, as shown in FIG. 3(b), the epoxy underfill material is injected into the bonding portion between resin molded body 41B and substrate 42, and hardened. Further, thereafter, as shown in FIG. 3(c), lens holder 41A including IR filter 45 and lens 44 are mounted on resin molded body 41B.

However, the configuration procedure shown in the above FIG. 3 has the problem shown below. Namely, when injecting and filling the underfill material between resin molded body 41B and substrate 42, it is necessary to harden the underfill material on the order of 100-200° C. using a constant temperature chamber, which complicates the manufacturing process.

Also, in the filling process for injecting and hardening the underfill material, an overall semiconductor apparatus on the way of manufacturing is exposed in a relatively high temperature atmosphere. Therefore, in order to avoid a bad influence such as lens deformation and blur caused by the high temperature, lens holder 41A having IR filter 45 and lens 44 cannot be mounted on resin molded body 41B before the completion of the underfill material filling process. Accordingly, light-receiving face 10Aa of imaging device 10A is exposed outside from when solid imaging device 10A is mounted on resin molded body 41B until the underfill material filling process is completed, which causes a risk of foreign substances such as dust and dirt being attached on light-receiving face 10Aa. Such the foreign substances being attached to light-receiving face 10Aa may affect the image.

Additionally, in the patent document 2 (the official gazette of the Japanese Unexamined Patent Publication No. Sho-57-162398) shown below, there has been disclosed a technique for configuring an electronic apparatus by disposing electronic components in a space formed by bending a reinforcement plate having a copper foil face, enabling achievement of the electromagnetic wave shield effect without a special metal case for shielding an electromagnetic wave.

Patent document 1: The official gazette of the Japanese Unexamined Patent Publication No. 2003-189195.

Patent document 2: The official gazette of the Japanese Unexamined Patent Publication No. Sho-57-162398.

DISCLOSURE OF THE INVENTION

It is an object of the present invention to provide an imaging apparatus enabling protection of the bonding portion between a case body and a substrate without filling an underfill material.

As a first configuration of the imaging apparatus according to the present invention to achieve the aforementioned object, the imaging apparatus includes: a lens holder having an imaging lens; an imaging device receiving incident light from the imaging lens; a molded body having a plurality of faces including a face for mounting the lens holder, a face for mounting the imaging device, and a face having an external connection terminal; and a flexible substrate connecting with the external connection terminal of the molded body. In order to cover at least one face among the plurality of faces of the molded body, the above flexible substrate is bent along the face.

According to the first configuration, when a load is applied to the flexible substrate, the load concerned can be received at the bent portion of the flexible substrate by means of the flexible substrate being bent along the face of the molded body. Thus, there is formed a structure in which the load is hard to be applied to the external connection terminal, making reinforcement by filling the underfill material unnecessary.

As a second configuration of the imaging apparatus according to the present invention, in the above first configuration, the flexible substrate is glued to at least one face among the plurality of faces of the molded body.

According to the second configuration, because the flexible substrate is glued to the molded body, the flexible substrate can be fixed in a bent state, and thus, a structure in which the load is not transmitted to the external connection terminal can be obtained.

As a third configuration of the imaging apparatus according to the present invention, in the above first or second configuration, the flexible substrate is bent to surround the circumference of the molded body by covering the plurality of faces of the molded body.

According to the third configuration, because the flexible substrate surrounds the circumference of the molded body, the number of bends can be increased, and thus, a structure in which the load is harder to be applied to the external connection terminal can be obtained.

As a fourth configuration of the imaging apparatus according to the present invention, in the above first or second configuration, the flexible substrate is bent to cover a face for mounting the imaging device of the molded body.

According to the fourth configuration, by covering the imaging device, it becomes possible to prevent light from entering from the back face on the opposite side to the light receiving face of the imaging device.

As a fifth configuration of the imaging apparatus according to the present invention, in the above first or second configuration, the flexible substrate is bent to cover the face for mounting the lens holder of the molded body, and the flexible substrate includes an aperture in a portion for mounting the lens holder.

According to the fifth configuration, because the above flexible substrate includes the aperture in the portion for mounting the lens holder, the light incidence on the imaging lens is not intercepted.

As a sixth configuration of the imaging apparatus according to the present invention, in the above first or second configuration, the flexible substrate is equipped with an electromagnetic wave shield material on one or both faces.

According to the sixth configuration, because of the electromagnetic wave shield effect by means of the flexible substrate, it becomes possible to reduce the influence of an electromagnetic wave from outside upon electronic components incorporated in the molded body.

As a seventh configuration of the imaging apparatus according to the present invention, in the above sixth configuration, the above one face is a face side of the flexible substrate contacting to the plurality of faces of the molded body.

According to the seventh configuration, it becomes possible to obtain the shield effect to inside the molded body against an electromagnetic wave produced from the flexible substrate also.

As an eighth configuration of the imaging apparatus according to the present invention, in the above sixth or seventh configuration, the flexible substrate is bent to surround the circumference of the molded body by covering the plurality of faces of the molded body including the face for mounting the lens holder and the face for mounting the imaging device, and the flexible substrate includes an aperture in a portion for mounting the lens holder on the face for mounting the lens holder.

According to the eighth configuration, because the flexible substrate covers the most portion of the molded body in the shape of covering the imaging device also, it becomes possible to achieve a high electromagnetic wave shield effect.

As a ninth configuration of the imaging apparatus according to the present invention, in the above eighth configuration, the flexible substrate includes: a first cover portion for covering a face of the molded body not covered by surrounding the circumference of the molded body and exposed outside; and a second cover portion for covering a face of the lens holder exposed outside, excluding a portion having light incident on the imaging lens.

According to the ninth configuration, because the entire portions of the molded body and the portion of the lens holder which can be covered are covered with the flexible substrate, the electromagnetic wave shield effect can be achieved substantially perfectly.

Further, in the present invention, there is provided a semiconductor apparatus including: a semiconductor device performing a predetermined function; a case body having the semiconductor device mounted thereon and also having an external connection terminal; and a flexible substrate connecting with the external connection terminal of the case body. The above flexible substrate is bent along each face so as to cover a plurality of faces of the case body.

According to the semiconductor apparatus having the above configuration, when a load is applied to the flexible substrate, the load concerned can be received at the bent portion of the flexible substrate by means of the flexible substrate being bent along the face of the molded body. Thus, there is formed a structure in which the load is hard to be applied to the external connection terminal bonding to the flexible substrate, making it unnecessary to reinforce the bonding portion by filling the underfill material, etc.

Further, in the semiconductor apparatus having the above-mentioned configuration, preferably, the flexible substrate is glued to at least one face among the plurality of faces of the case body. By gluing the flexible substrate to the case body, the flexible substrate can be fixed in a bent state, and a structure can be formed so as not to transmit the load to the external connection terminal.

In the semiconductor apparatus having the above configuration, the flexible substrate may be equipped with an electromagnetic wave shield material on one or both faces. Due to the electromagnetic wave shield effect by means of the flexible substrate, it becomes possible to reduce the influence of an electromagnetic wave upon the semiconductor device and the electronic components incorporated in the case body.

PREFERRED EMBODIMENTS OF THE INVENTION

Hereafter, the embodiments of the present invention will be described referring to the drawings. However, the described embodiments are not intended to limit the technical scope of the present invention.

Figure 4:
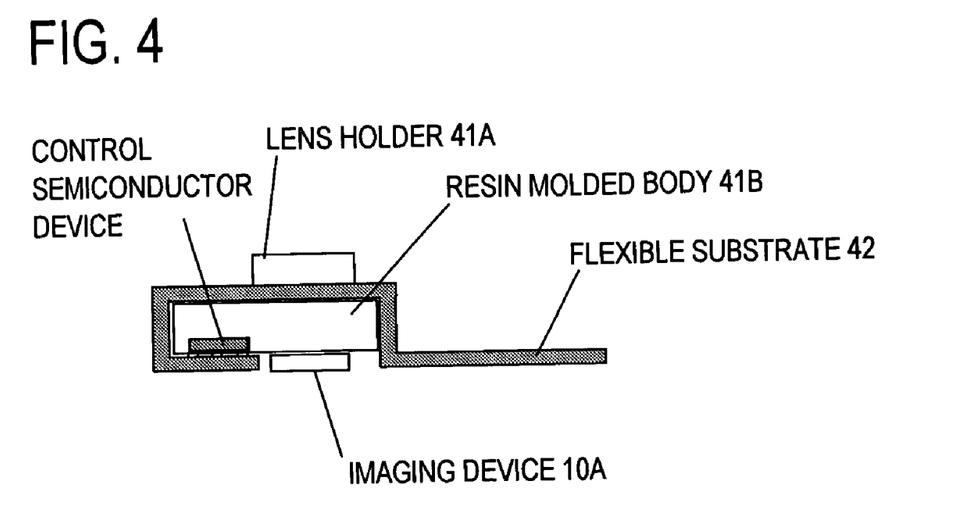
FIG. 4 shows a diagram illustrating a first exemplary configuration of the imaging apparatus according to the embodiment of the present invention.

FIG. 4 is a diagram illustrating a first embodiment of the imaging apparatus according to an embodiment of the present invention. In FIG. 4, like components to the configuration components shown in FIG. 1 are referred to by like symbols, and the description thereof is omitted. Also, there is shown an outer view, instead of the cross section of an internal structure as shown in FIG. 1. In the first exemplary configuration, a flexible substrate 42 is bent along each face of a resin molded body 41B so as to surround resin molded body 41B. By bending flexible substrate 42, the load applied to flexible substrate 42 is received at the bent portion thereof, which forms a structure that the load is hard to be transmitted to the bonding portion of an external connection terminal 41Bd. Further, by fixing a portion of flexible substrate 42 with resin molded body 41B using an adhesive agent, etc., there is formed a structure in which a stress is not transmitted to the direction of peeling external connection terminal 41Bd from flexible substrate 42. The number of points of resin molded body 41B glued to flexible substrate 42 is at least one point (one face), and a plurality of points may be glued.

Figure 5A:
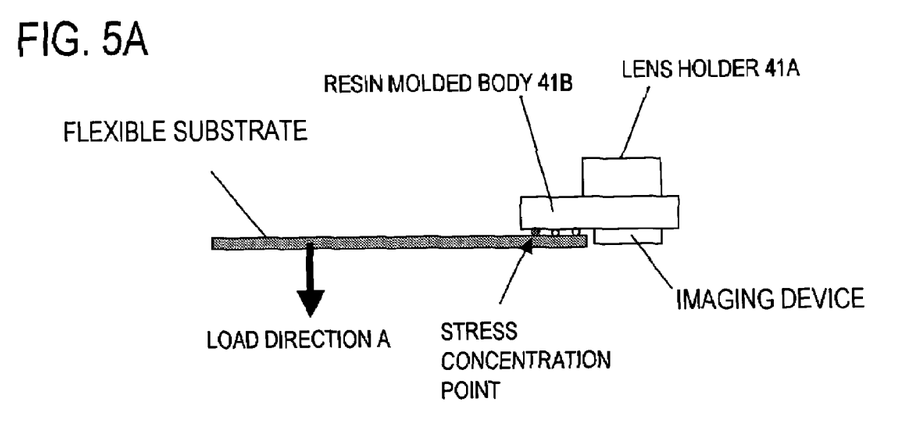
FIG. 5 shows a diagram illustrating a stress concentration point depending on the direction of a load applied to a flexible substrate.
Figure 5B:
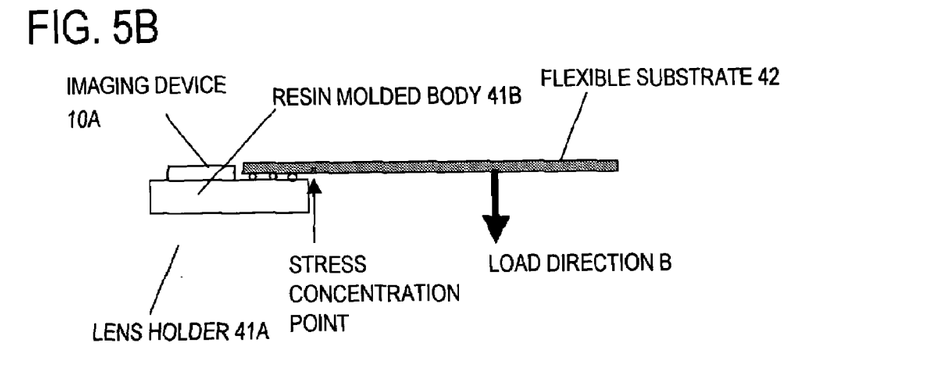

FIG. 5 is a diagram illustrating a stress concentration point depending on the direction of the load applied to the flexible substrate. As shown in FIG. 5(a), when the load is applied to flexible substrate 42 in a direction A, the stress concentration point is the bonding portion between external connection terminal 41Bd and flexible substrate 42. On the other hand, as shown in FIG. 5(b), when the load is applied to the flexible substrate in a direction B opposite to the direction A, the stress concentration point is a portion of flexible substrate 42 contacting to resin molded body 41B when flexible substrate 42 is bent along the external face of resin molded body 41B. Therefore, the load is not applied directly to the bonding portion between external connection terminal 41Bd and flexible substrate 42, and the strength against the load applied in the direction B is approximately ten times greater than the strength against the load applied in the direction A.

According to the embodiment of the present invention, there is formed a configuration such that a large load is not applied to the bonding portion between external connection terminal 41Bd and flexible substrate 42 by bending flexible substrate 42 in such a direction that the load is not applied directly to the bonding portion between external connection terminal 41Bd and flexible substrate 42, namely, along the plurality of faces of resin molded body 41B, and further, by processing the shape of flexible substrate 42 so as to surround resin molded body 41B. By this, it becomes unnecessary to reinforce the strength of the bonding portion between external connection terminal 41Bd and flexible substrate 42, and thus, the underfill material filling process also becomes unnecessary. Further, because the underfill material filling process is unnecessary, lens holder 41A and imaging device 10A can be mounted onto resin molded body 41B substantially simultaneously, and therefore, light-receiving face 10Aa of imaging device 10A is not exposed outside, and foreign substances such as dust and dirt are not attached on light-receiving face 10Aa.

Figure 6A:
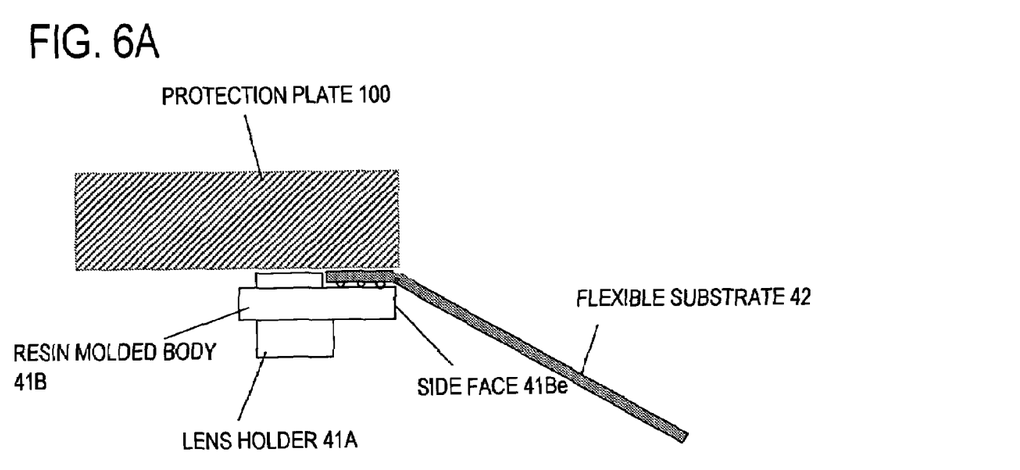
FIG. 6 shows a diagram illustrating a bending process of flexible substrate 42.
Figure 6B:
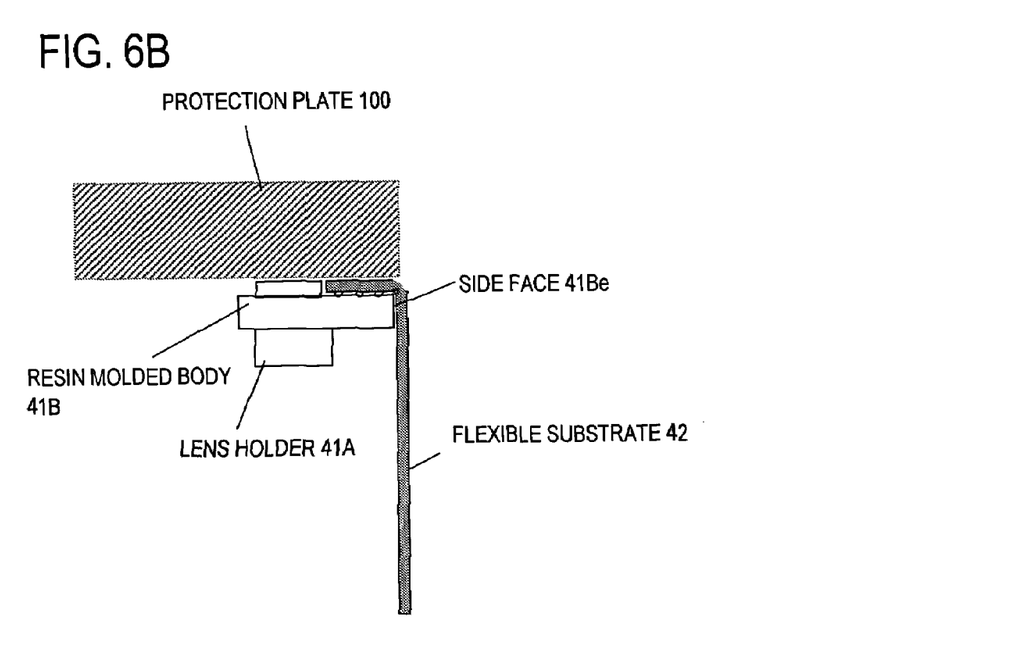
Figure 7A:
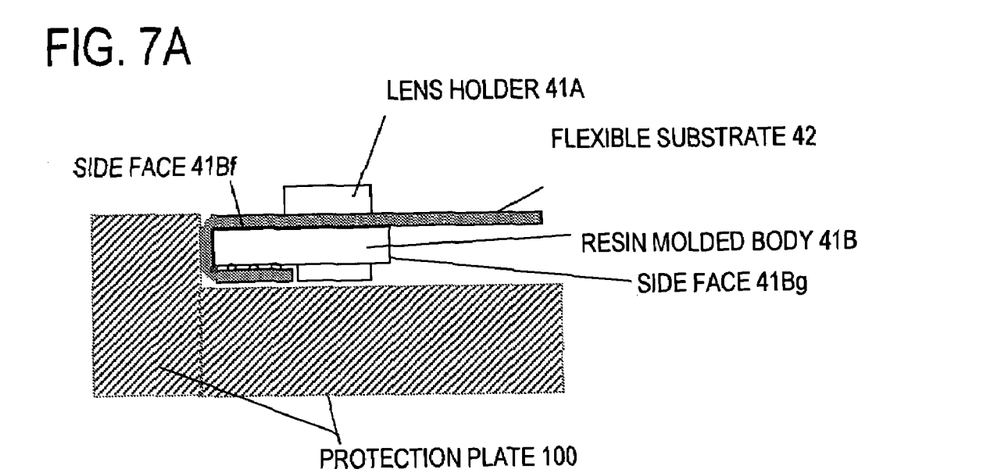
FIG. 7 shows a diagram illustrating a bending process of flexible substrate 42.
Figure 7B:
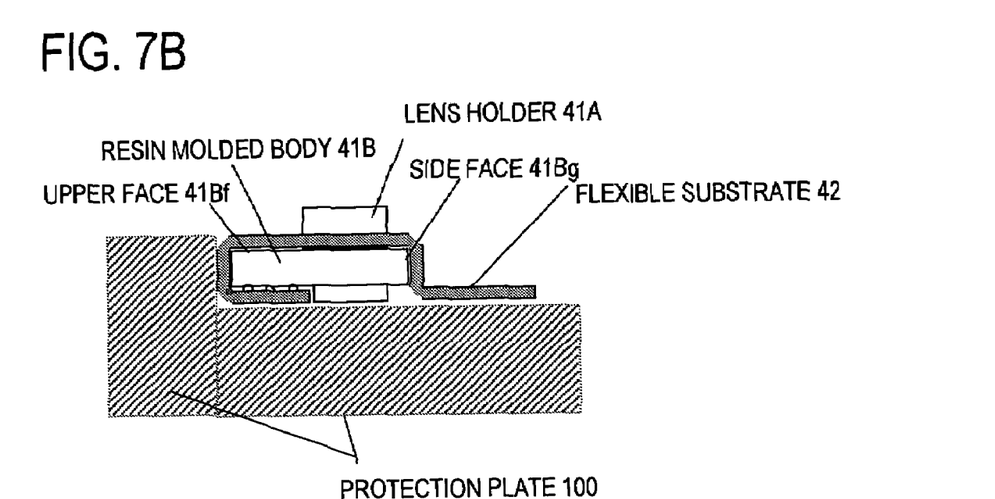

FIGS. 6 and 7 are diagrams illustrating a bending process of flexible substrate 42. The bending process of flexible substrate 42 is carried out after imaging device 10A and lens holder 41A are mounted on resin molded body 41B. In FIG. 6(a), flexible substrate 42 is bent along side face 41Be of resin molded body 41B, while bottom face 41Bb of resin molded body 41B is being pressed with a protection plate 100 so that the load is not applied to the bonding portion between external connection terminal 41Bd and flexible substrate 42, and as shown in FIG. 6(b), flexible substrate 42 is then bent to a substantially right angle. Next, as shown in FIG. 7(a), flexible substrate 42 being bent to the substantially right angle is also pressed from a first side face 41Be side of resin molded body 41B with protection plate 100, so that flexible substrate 42 is bent to cover the upper face 41Bf of resin molded body 41B. On flexible substrate 42, there is provided an aperture 42A so that flexible substrate 42 is fit to the outer circumference of lens holder 41A (refer to FIGS. 10, 12 described later), and that flexible substrate 42 does not cover aperture 41Aa of lens holder 41A. Then, as shown in FIG. 7(b), flexible substrate 42 is further bent along a second side face 41Bg of resin molded body 41B, and finally, the tip of flexible substrate 42 is bent to the connecting direction with an external apparatus, depending on the necessity. In the first exemplary configuration shown in FIG. 4, and also in FIG. 7(b), the tip of flexible substrate 42 is bent to extend toward the outside of the second side face 41Bg of resin molded body 41B.

Figure 8:
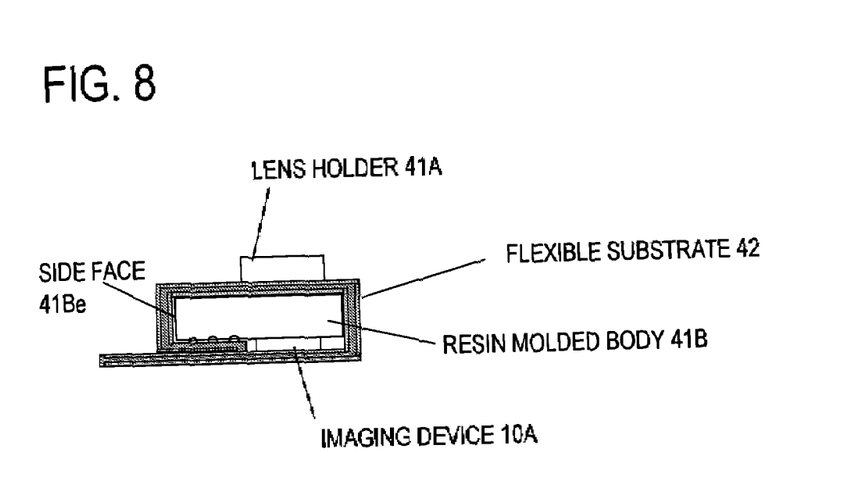
FIG. 8 shows a diagram illustrating a second exemplary configuration of the imaging apparatus according to the embodiment of the present invention.

FIG. 8 is a diagram illustrating a second exemplary configuration of the imaging apparatus according to the embodiment of the present invention. In the second exemplary configuration, flexible substrate 42 is bent to cover the back face of imaging device 10A also, and thus flexible substrate 42 covers the circumference of resin molded body 41B. By bending flexible substrate 42 to cover the circumference of resin molded body 41B, the number of bends is increased, and the load receiving points are increased. Thus, the load applied to the flexible substrate becomes harder to be transmitted to the external connection terminal. The tip of flexible substrate 42 extends on the first side face 41Be side of resin molded body 41B. By covering the back face of imaging device 10A with flexible substrate 42, it is possible to prevent damage on the back face of imaging device 10A. Also, it becomes possible to prevent entrance of light from the back face of imaging device 10A. Conventionally, it has been necessary to prepare a component for dedicated use to prevent entrance of light from the back face of imaging device 10A. However, in the second exemplary configuration, flexible substrate 42 is commonly used therefor, enabling reduction of the number of components. Additionally, even in case that the back face of imaging device 10A is covered with flexible substrate 42, it may also be possible to mount a protection member, such as a buffer material for protecting imaging device 10A, on the outside of flexible substrate 42 covering imaging device 10A.

Also, it may be possible to equip an electromagnetic wave shield material for shielding an electromagnetic wave on one or both faces of flexible substrate 42.

Figure 9:
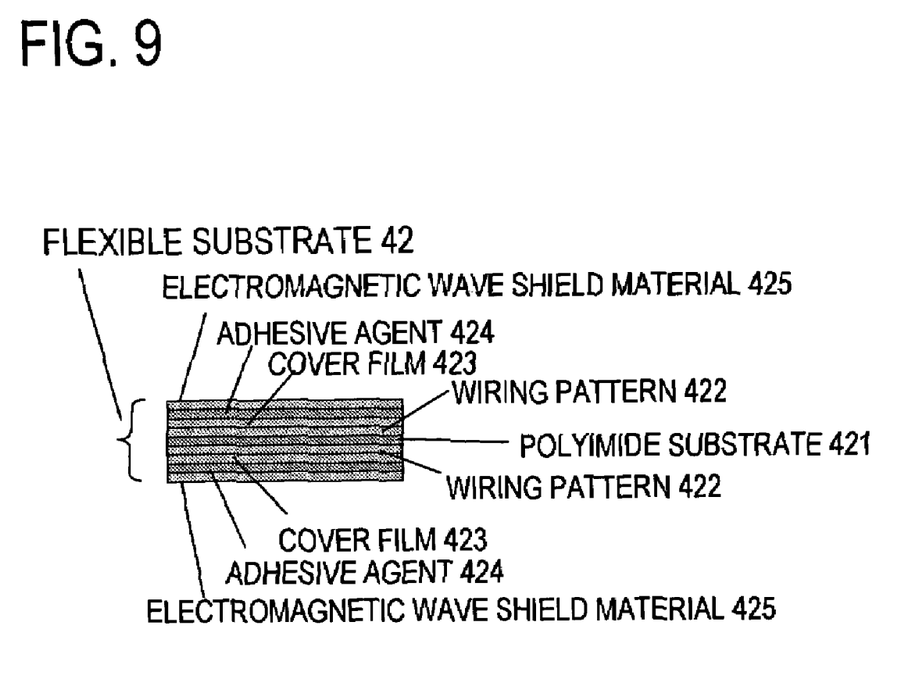
FIG. 9 shows a cross-sectional view of a portion of flexible substrate 42 equipped with an electromagnetic wave shield material.

FIG. 9 is a cross-sectional view of a portion of flexible substrate 42 equipped with the electromagnetic wave shield material. In FIG. 9, there is shown an example that the electronic wave shield materials are equipped on both faces of flexible substrate 42. On both faces of a polyimide film 421, there is provided a wiring pattern 422 of copper wire, which is covered with a cover film 423. An adhesive agent 424 is then coated on cover film 423, on which an electromagnetic wave shield material 425 is pasted. As electromagnetic wave shield material 425, for example, gold, silver, copper, platinum an alloy film thereof is used. The thickness of electromagnetic wave shield material 425 ranges from several μm to several tens μm. By covering a case body 41 constituted of resin molded body 41B and lens holder 41A with flexible substrate 42 equipped with the electromagnetic wave shield material on at least one face, it is possible to eliminate an influence of the electromagnetic wave upon the semiconductor device in resin molded body 41B and imaging device 10A.

Further, by equipping the electromagnetic wave shield material on the face of flexible substrate 42 contacting to resin molded body 41B when flexible substrate 42 is wrapped around resin molded body 41B, it is also possible to shield against the electromagnetic wave generated from flexible substrate 42. By equipping the electromagnetic wave shield material on both faces of flexible substrate 42, the shield effect can be increased further. Needless to say, it may also be possible to equip the electromagnetic wave shield material on the face not contacting to resin molded body 41B when flexible substrate 42 is wrapped around resin molded body 41B.

In case of achieving the electromagnetic wave shield function by means of flexible substrate 42, it is preferable to have a configuration that flexible substrate 42 covers the back face of imaging device 10A, using the above second configuration shown in FIG. 8. Further, it is preferable that the entire side faces of resin molded body 41B and the cylinder-shaped outer circumference face of lens holder 41A are also covered with flexible substrate 42. Namely, it is preferable to form a configuration that the entire case body 41 excluding aperture 41Aa of lens holder 41A is covered with flexible substrate 42. An exemplary configuration of flexible substrate 42 having such the configuration is shown in the next FIG. 10.

Figure 10:
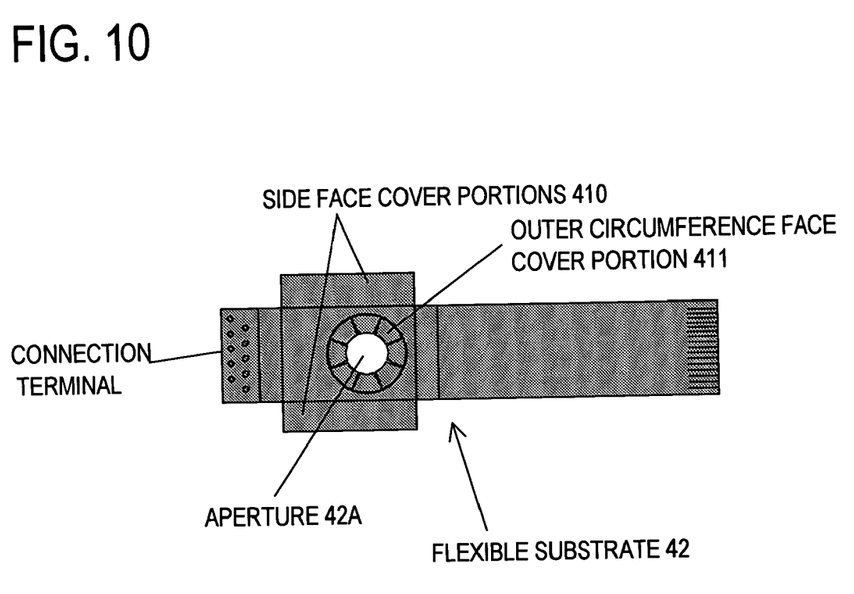
FIG. 10 shows a development view of flexible substrate 42 for covering the entire case body 41.

FIG. 10 is a development view of flexible substrate 42 for covering the entire case body 41. Flexible substrate 42 shown in FIG. 10 has a configuration corresponding to the above second exemplary configuration shown in FIG. 8. Flexible substrate 42 includes side face cover portions 410 for covering two side face portions of resin molded body 41B which are not covered with flexible substrate 42 when flexible substrate 42 is wrapped along each face of resin molded body 41B as shown in the above FIG. 8, and an outer circumference face cover portion 411 for covering the outer circumference face of lens holder 41A. By bending the above each portion to fit to each face, the entire case body 41 can be covered with flexible substrate 42.

Figure 11:
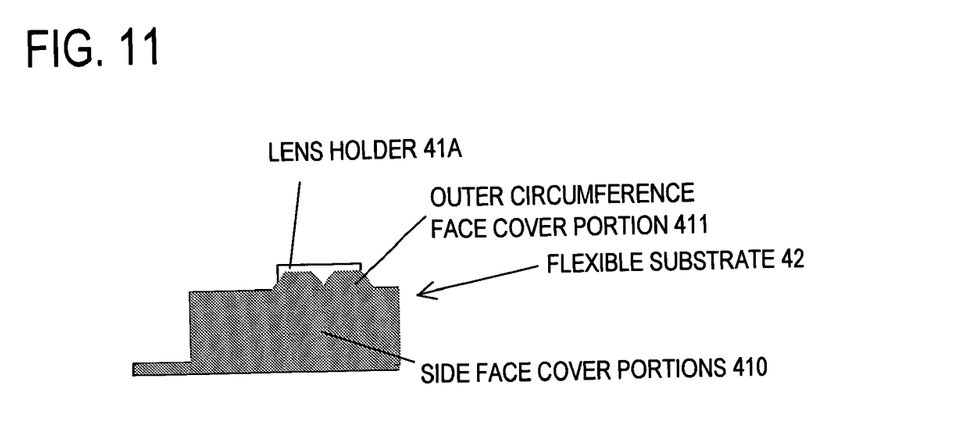
FIG. 11 shows a schematic outer view of an imaging apparatus when case body 41 is covered with flexible substrate 42 exemplified in FIG. 9.

FIG. 11 is a schematic outer view of the imaging apparatus when case body 41 is covered with flexible substrate 42 exemplified in FIG. 10. The side faces of resin molded body 41B around which flexible substrate 42 is not wrapped are covered with side face cover portions 410, and the outer circumference face of lens holder 41A is also covered with outer circumference face cover portion 411.

Figure 12A:
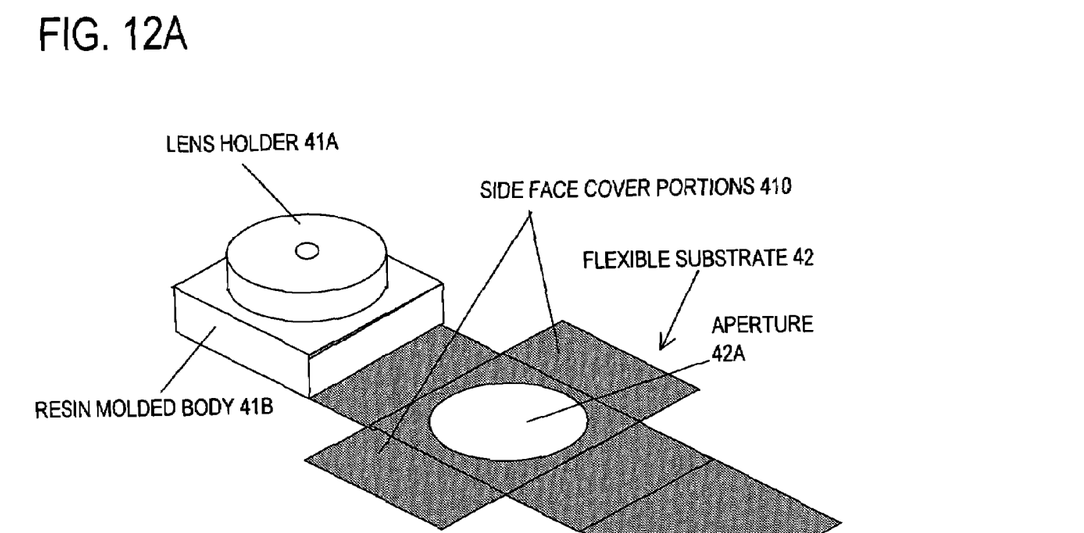
FIG. 12 shows a perspective view of an imaging apparatus when case body 41 is covered with flexible substrate 42 having side face cover portions 410.
Figure 12B:
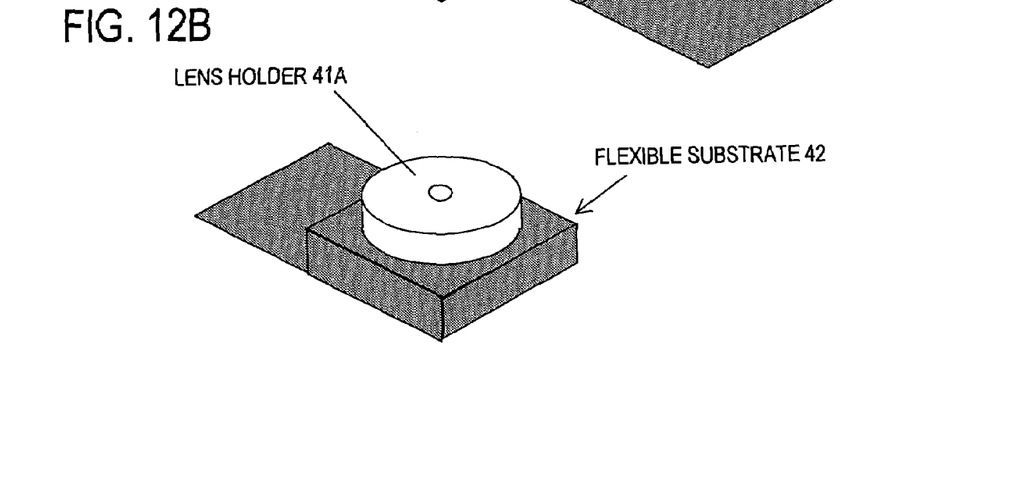

FIG. 12 is a perspective view of the imaging apparatus when case body 41 is covered with flexible substrate 42 having side face cover portions 410. In the present example, outer circumference face cover portion 411 for covering the outer circumference face of lens holder 41A is not provided.

The above-mentioned featured configuration in the embodiment of the present invention is to be applied to not only the imaging apparatus, but entire semiconductor apparatuses each constituted of a case body for mounting a semiconductor device and a flexible substrate bonding to an external connection terminal provided on the case body.

INDUSTRIAL APPLICABILITY

In a semiconductor apparatus, particularly an imaging apparatus having an imaging device constituted of a semiconductor device, a bonding portion between a case body and a substrate can be protected, preventing the bonding portion between the case body and the substrate from being peeled off, without reinforcement by filling an underfill material into the bonding portion between the case body and the substrate.

By surrounding the case body using the substrate equipped with an electromagnetic wave shield material, it is possible to reduce the influence of an electromagnetic wave upon electronic components in the case body without covering the electronic components with a metal case.

What is claimed is:

1. An imaging apparatus comprising:
a lens holder having an imaging lens;
an imaging device receiving incident light from the imaging lens;
a molded body having a plurality of faces including a main face for mounting the lens holder, a back face for mounting the imaging device and having an external connection terminal, a side face and another side face; and
a flexible substrate on surface of which a wiring pattern is formed, having a connection terminal on the surface for connecting with the external connection terminal of the molded body,
wherein the flexible substrate covers the side face, the main face, the another side face and the back face of the molded body with the wiring pattern inside an outermost surface of the flexible substrate, and the flexible substrate is bent around the molded body to cover the imaging device and the external connection terminal, and
wherein the flexible substrate is glued to at least one face among the plurality of faces of the molded body.

2. The imaging apparatus according to claim 1,
wherein the flexible substrate is bent to cover the face for mounting the lens holder of the molded body, and the flexible substrate comprises an aperture in a portion for mounting the lens holder.

3. The imaging apparatus according to claim 1,
wherein the flexible substrate is equipped with an electromagnetic wave shield material on one or both faces.

4. The imaging apparatus according to claim 3,
wherein the one face is a face side of the flexible substrate contacting to the plurality of faces of the molded body.

5. The imaging apparatus according to claim 3,
wherein the flexible substrate is bent to surround the circumference of the molded body by covering the plurality of faces of the molded body including the face for mounting the lens holder and the face for mounting the imaging device, and
wherein the flexible substrate comprises an aperture in a portion for mounting the lens holder on the face for mounting the lens holder.

6. The imaging apparatus according to claim 1,
wherein the flexible substrate is bent to surround the circumference of the molded body by covering the plurality of faces of the molded body.

7. The imaging apparatus according to claim 1,
wherein the flexible substrate is bent to cover a face for mounting the imaging device of the molded body.

8. The imaging apparatus according to claim 1,
wherein the flexible substrate is bent to cover the face for mounting the lens holder of the molded body, and the flexible substrate comprises an aperture in a portion for mounting the lens holder.

9. The imaging apparatus according to claim 1,
wherein the flexible substrate is equipped with an electromagnetic wave shield material on one or both faces.

10. The imaging apparatus according to claim 9,
wherein the one face is a face side of the flexible substrate contacting to the plurality of faces of the molded body.

11. The imaging apparatus according to claim 9,
wherein the flexible substrate is bent to surround the circumference of the molded body by covering the plurality of faces of the molded body including the face for mounting the lens holder and the face for mounting the imaging device, and
wherein the flexible substrate comprises an aperture in a portion for mounting the lens holder on the face for mounting the lens holder.

12. The imaging apparatus according to claim 11,
wherein the flexible substrate comprises:
a first cover portion for covering a face of the molded body not covered by surrounding the circumference of the molded body and exposed outside; and
a second cover portion for covering a face of the lens holder being outside, excluding a portion having light incident on the imaging lens.

13. A semiconductor apparatus comprising:
a semiconductor device performing a predetermined function;
a lens holder having an imaging lens;
a case body having a plurality of faces including a main face for mounting the lens holder, a back face for mounting the imaging device and having an external connection terminal, a side face and another side face; and
a flexible substrate having a surface on which a wiring pattern is formed, having a connection terminal on the surface for connecting with the external connection terminal of the case body,
wherein the flexible substrate covers the side face, the main face, the another side face and the back face of the case body with the wiring pattern inside an outermost surface of the flexible substrate, and the flexible substrate bent around the case body to cover the imaging device and the external connection terminal, and
wherein the flexible substrate is glued to at least one face among the plurality of faces of the case body.

14. The imaging apparatus according to claim 13,
wherein the flexible substrate is equipped with an electromagnetic wave shield material on one or both faces.

15. The imaging apparatus according to claim 13,
wherein the flexible substrate is equipped with an electromagnetic wave shield material on one or both faces.

* * * * *